US012801029B2

(12) United States Patent
Seidel et al.

(10) Patent No.: US 12,801,029 B2
(45) Date of Patent: Nov. 17, 2026

(54) METHOD FOR REGISTERING STRUCTURES ON MICROLITHOGRAPHIC MASKS, COMPUTER PROGRAM PRODUCT AND MICROLITHOGRAPHIC METHOD

(71) Applicant: Carl Zeiss SMT GmbH, Oberkochen (DE)

(72) Inventors: Dirk Seidel, Jena-Leutra (DE); Alexander Freytag, Erfurt (DE); Jonas Umlauft, Ansbach (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 758 days.

(21) Appl. No.: 18/206,673

(22) Filed: Jun. 7, 2023

(65) Prior Publication Data

US 2023/0393488 A1 Dec. 7, 2023

(30) Foreign Application Priority Data

Jun. 7, 2022 (DE) ......................... 102022114236.1

(51) Int. Cl.
*G03F 7/00* (2006.01)
*G03F 1/70* (2012.01)
*G03F 1/84* (2012.01)

(52) U.S. Cl.
CPC ................ *G03F 7/705* (2013.01); *G03F 1/70* (2013.01); *G03F 1/84* (2013.01)

(58) Field of Classification Search
CPC ... G03F 7/705; G03F 1/70; G03F 1/84; G03F 1/36; G03F 1/42; G03F 1/72; G03F 1/76; G03F 7/70504

(Continued)

(56) References Cited

U.S. PATENT DOCUMENTS

2005/0220332 A1 10/2005 Akutagawa et al.
2013/0019212 A1 1/2013 Seidel et al.

(Continued)

FOREIGN PATENT DOCUMENTS

DE 102011078999 1/2013
DE 102018207876 6/2019

OTHER PUBLICATIONS

The Office Action issued by the German Patent Office for Application No. DE 10 2022 114 236.1, dated Jan. 4, 2023 (with English Machine Translation).

(Continued)

*Primary Examiner* — Paul Dinh
(74) *Attorney, Agent, or Firm* — Fish & Richardson P.C.

(57) ABSTRACT

The invention relates to a method for registering structures on microlithographic masks comprising the comparison of a recorded measurement image of a mask and the target design underlying the mask, wherein the target design underlying the mask is converted into a simulated reference image that is directly comparable with the measurement image with the aid of an optical simulation, wherein the optical simulation is fully automatically differentiable in such a manner that a metric that is determined from the recorded measurement image and the reference image simulated in the forward mode and represents the differences allows in the backward mode a representation of the actual design of the mask that is directly comparable with the target design for the purpose of determining possible defects of the mask.

The invention furthermore relates to a corresponding computer program product and to the use of the above method in the course of a microlithographic process.

20 Claims, 2 Drawing Sheets

(58) Field of Classification Search
USPC ............................................................ 716/51
See application file for complete search history.

(56) References Cited

U.S. PATENT DOCUMENTS

2020/0278604 A1* 9/2020 Lo ............................ G03F 1/36
2022/0128899 A1* 4/2022 Fujimura .................. G03F 1/36

OTHER PUBLICATIONS

Soubies et al., "Efficient inversion of multiple-scattering model for optical diffraction tomography", *Optics Express,* vol. 25, No. 18 (Sep. 4, 2017).
Wang et al., "Image Quality Assessment: From Error Visibility to Structural Similarity", *IEEE Transactions on Image Processing,* vol. 13, Issue 4 (Apr. 2004).

* cited by examiner

METHOD FOR REGISTERING STRUCTURES ON MICROLITHOGRAPHIC MASKS, COMPUTER PROGRAM PRODUCT AND MICROLITHOGRAPHIC METHOD

CROSS-REFERENCE TO RELATED APPLICATIONS

The present application claims the priority of German patent application 10 2022 114 236.1, filed on Jun. 7, 2022. The content of that German patent application is incorporated by reference in its entirety.

TECHNICAL FIELD

The invention relates to a method for registering structures on microlithographic masks, and to a corresponding computer program product and a microlithographic method.

BACKGROUND

Microlithography is used for producing microstructured components, such as for example integrated circuits. The microlithography process is carried out in what is known as a projection exposure apparatus, which has an illumination device and a projection device. The image of a mask (also called "reticle") illuminated by use of the illumination device is projected in this case by use of the projection device onto a substrate, for example a silicon wafer, that is coated with a light-sensitive layer (so-called "photoresist") and arranged in the image plane of the projection device in order to transfer the mask structure to the light-sensitive coating of the substrate. In subsequent production steps, the transferred structure is implemented in the substrate, e.g. by etching.

Even if the projection devices of projection exposure apparatuses have a reduction factor of, e.g., 8:1, the structures of the masks already need to have a high accuracy owing to the advancing miniaturization in the semiconductor field and the transition in the wavelength during exposure from DUV (e.g. 193 nanometers) to the EUV (e.g. 13.5 nm). In order to ensure that a mask satisfies these quality requirements and a microstructured component produced thereby also has the desired properties and functioning mode, a mask is checked for deviations from the structure actually desired by use of suitable methods before use in a projection exposure apparatus.

One possibility for carrying out this checking is the measurement of the positions (also called "registration") of structures on a photolithographic mask by use of a mask metrology device. In that case, the positions of structures on the mask need to be able to be ascertained with an accuracy of regularly below 0.5 nm with a repeatability of below 0.2 nm.

In the case of mask metrology devices in which the mask to be registered is illuminated in order to be imaged onto an image capture unit, e.g. a charged coupled device (CCD) sensor, via an optical unit, there occur optical image aberrations owing to manufacturing tolerances, illumination fluctuations, sensor distortions and other effects which at least at present in the context of manufacturing cannot be avoided to a sufficient extent that an image representation of a mask that is recorded by a mask metrology device directly satisfies the aforementioned accuracy requirement so as then to be able to be examined directly for possible defects in comparison with the structure actually desired. Specifically, it would not be ensured that a deviation possibly established is actually attributable to a defect of the mask, but not owing to inadequate accuracy of the mask metrology device.

Moreover, during registration using mask metrology devices, distortions in image representations of specific structures occur owing to optical effects, and likewise cannot be avoided through structural measures on mask metrology devices. In this regard, e.g. the positions of structures at the edge of a periodically structured region, i.e. the position of the last lines in a line grating having a finite width, may be displaced in the image representation. This so-called "optical proximity" (AP) error arises owing to the low-pass filtering of the electromagnetic field in the imaging beam path and as such is unavoidable. Here too it is not possible, in principle, if a deviation between the image representation of the mask and the structure actually desired is established, to be able to assume that a defect of the mask is definitely involved.

In order to increase the defect detection reliability in the case of mask metrology devices, it is known for an image representation recorded by such a device not to be compared directly with the desired structure, but rather with a simulated image representation of said structure. In that case, the simulated image representation represents the theoretical image representation—recorded by a mask metrology device—of an ideal mask according to the desired structure. In other words, the simulated image representation thus corresponds to an image representation of the desired structure that is inaccurate, e.g. distorted, owing to the physical and technical aspects of the imaging of a real mask metrology device.

In the event of comparison between a recorded image representation of a real mask and the simulated image representation of the desired structure, what is important for the defect detection reliability is no longer directly the imaging precision of a mask metrology device, but rather the accuracy of the simulation of the optical properties of the mask metrology device that is used for creating the simulated image representation.

This method, also referred to as "Die2Database", is described, e.g., in DE 10 2011 078 999 A1, the entire content of which is incorporated by reference.

Said document furthermore discloses an iterative method for optimizing the simulation of the optical properties of a mask metrology device, which is carried out individually for each mask to be registered. In a first pass, all the parameters of the optical simulation are regarded as freely variable and, through repeated comparison of recorded image representations of different parts of the mask with the respectively associated desired structure or with the simulated image representation created on the basis of the simulation parameters determined until the respective recording time, are altered iteratively until the resulting deviation between recorded image representations and associated simulated image representations is as minimal as possible. If the purportedly optimum parameters of the optical simulation have thus been found, a final simulated image representation of the desired structure can be created, which is then used for the comparison with a recorded image representation for the purpose of detecting possible defects.

Since the method from DE 10 2011 078 999 A1 has to be carried out individually for each mask and the optical simulation generally has a large number of parameters, the iterative optimization proposed therein requires considerable computation time and consequently a considerable execution time for the registration of an individual mask. In particular, it has been found that there is often delayed convergence for the demanding optimization algorithms.

Moreover, it is not always possible to completely rule out a situation in which the optimum of the simulation parameters that is discovered in the course of the method is not the absolute optimum.

In document DE 10 2018 207 876 A1 (the entire content of which is incorporated by reference), a machine learning method is used as a central element for the optical simulation. Owing to the complexity of the optical system, however, the training of the optical simulation necessitates a considerable number of training data, which furthermore require previous highly accurate preregistration of the masks used for training data in order to prevent registration errors from being inadvertently "concomitantly learned". Therefore, the training of the optical simulation is time-consuming. This holds true particularly if the optical simulation is intended to be used for different structure types; in this case, it is necessary to ensure that the training data contain sufficiently many exemplary structures of the different structure types desired, which means that there is regularly a significant increase in the number of training data required.

Proceeding from documents DE 10 2011 078 999 A1 and DE 10 2018 207 876 A1, which propose fundamentally practicable methods for registering structures on microlithographic masks, the present invention is based on the aspect of providing improvements over the prior art that are less time-consuming and/or computationally intensive.

This aspect is achieved by means of the independent claims. The dependent claims relate to advantageous refinements.

SUMMARY

Accordingly, the invention relates to a method for registering structures on microlithographic masks, comprising the comparison of a measurement image of a mask recorded by a mask metrology device and the target design underlying the mask, wherein the target design underlying the mask is converted into a simulated reference image that is directly comparable with the measurement image with the aid of an optical simulation, wherein the optical simulation is fully automatically differentiable in such a manner that in the forward mode a metric that is determined from the recorded measurement image and the simulated reference image and represents the differences allows in the backward mode a representation of the actual design of the mask that is directly comparable with the target design for the purpose of determining possible defects of the mask.

Moreover, the invention relates to a computer program product or a set of computer program products, comprising program parts which, when loaded into a computer or into networked computers, are designed to carry out the method according to the invention.

Furthermore, the invention relates to a microlithographic method in which, with the aid of a projection exposure apparatus comprising an illumination device and a projection device, the image of a mask illuminated by use of the illumination device is projected by use of the projection device onto a substrate that is coated with a light-sensitive layer and is arranged in the image plane of the projection device, wherein before the exposure of the substrate, the mask is registered and examined for defects by way of a method according to the invention and the exposure of the substrate is carried out only in the event of sufficient freedom from defects being established.

Firstly, some terms used in connection with the invention are explained.

A simulation is "fully automatically differentiable" if the programming function for arriving at a simulation result directly proceeding from initial data can be converted into an extended procedure in which the function is described as a sequence of intermediate step functions which each comprise only few elementary functions and for each of which one or more derivatives are formed analytically as well. From the intermediate step functions formed in the so-called forward mode and the derivatives thereof, an equation system thus results in which the individual equations, owing to their property as elementary functions, are generally very simple and each have only few variables and parameters. A variety of methods are known for converting an arbitrary predefined function into a corresponding equation system which, if appropriate, can also be taken into account with regard to special technical features of the computer provided for solving the equation system, in order to utilize the computational capacity as optimally as possible. In the so-called backward mode, the various parameters of the equation system or of the optical simulation can be determined analytically, in principle, with the aid of predefined initial data and the associated desired simulation results. In this case, the simulation is deemed only to be "fully" automatically differentiated if actually all the data from the initial data to the simulation result, i.e. end-to-end, are automatically differentiable or differentiated.

The term "defect of a mask" should preferably be understood broadly in connection with the present invention. Besides defects in the narrower sense where, e.g., individual elements of the structure on the mask are not formed completely correctly (e.g., perforated lines, blurred edges or corners), so-called "registration errors" can then be included, too, in which relatively large partial regions of the structure are incorrectly positioned, in particular displaced, in relation to other partial regions of the structure or alignment markings on the mask.

The image recording region of known mask metrology devices is usually smaller than a mask provided for microlithography, which is why the registration of the mask structure then only ever takes place section by section. The mask can then be moved by way of a so-called reticle stage through the image recording region of the mask metrology device in such a way that gradually the entire mask can be registered by the mask metrology device. For reasons of clarity, hereinafter the various designs, images, etc. are linguistically related only to the mask as such and not to segments thereof, although the latter case is nevertheless encompassed as well.

The invention is based on the insight that the use of a fully automatically differentiable simulation for determining reference images during the registration of structures on microlithographic masks is possible and advantageous over the prior art.

In this case, it has been found, surprisingly, that discovering suitable parameters of the equation system formed in the course of the automatic differentiation, and thus of the optical simulation in other words, also on the basis of pairs comprising target design and associated real measurement data, is efficiently possible and advantageous even though the real measurement data are always subject to a degree of blurring, in principle.

For this purpose, firstly, with the aid of the fully automatically differentiable simulation, in which the parameters of the equation system are fixed arbitrarily, preferably at zero in each case, a simulated reference image is generated from the target design of that mask for which a measurement image was recorded. Even if said simulated reference image possibly only scarcely corresponds to the recorded measurement image, the differences between the simulated reference image and the recorded measurement image can be represented in a metric. By way of example, a pixelwise difference, a corresponding root mean square, a so-called structure similarity index, as described in the article "Image quality assessment: from error visibility to structural similarity" by Z. Wang et al. in "IEEE Transactions on Image Processing," volume 13, issue 4 from April 2004, or an arbitrary combination thereof can be used as metric.

On the basis of one or different target designs and associated measurement images of created metrics, using the backward mode of the simulation, the calibration of the parameters of the underlying equation system can then be carried out efficiently by way of known optimization algorithms. In particular since the calculation of the diverse gradients required in this case does not require a numerical approximation, rather said calculation is possible purely analytically, the optimization is possible accurately and rapidly. Once optimum parameters have been calibrated, the simulation can be used directly to determine simulated reference images on the basis of target designs, which reference images can then be taken as a basis for a comparison with recorded measurement images. In this case, this comparison and the defect detection based thereon can be configured in accordance with the prior art.

In comparison to the methods known from the prior art, the method according to the invention is not just faster, but generally also requires significantly less computing power. By way of example, the number of computation operations to be carried out repeatedly is significantly reduced in comparison with iterative methods. By virtue of that, too, the method according to the invention is in principle faster than iterative methods from the prior art.

Furthermore, it has been found that in comparison to a known method based on machine learning, the number of pairs comprising target designs and actual recordings that are required for discovering the optimum parameters of the equation system is significantly smaller than the number of required training data sets for the training of an artificial intelligence known from the prior art for the registration of structures on microlithographic masks. Since in some instances considerable computation capacity is required for the analysis of each training set, the method according to the invention is significantly less computationally intensive in comparison with known methods based on machine learning. Moreover, the in some instances considerable complexity for the training of the artificial intelligence is obviated or the complexity for the calibration of the fully automatically differentiable simulation is regularly significantly lower by comparison therewith.

The complexity and the required computing power for the calibration of the parameters of the optical simulation or of the underlying equation system can be reduced further if verified actual designs and associated target designs are used for the calibration. Verified actual designs are masks whose structure has previously been registered highly precisely and which completely match the corresponding target design. In particular, for verified masks, the target design can also be created only on the basis of the registered actual design in order to ensure a complete match between target design and actual design. If a calibration takes place at least partly on the basis of verified actual designs, any uncertainty regarding the match between target design and actual design ceases to apply in the optimization of the parameters of the optical simulation for the data based on verified actual designs, for which reason all established deviations between simulated reference image and recorded measurement image are attributable, in principle, solely to a non-optimum calibration of the optical simulation. For the optimization, external uncertainty factors thus at least partly cease to apply, which can simplify the optimization and thus generally make it more computationally efficient as well.

Alternatively or additionally, it is preferred if the—preferably verified—actual design and the associated target design of at least one mask used for the calibration have a calibration structure, preferably a periodic line structure, through which the parameters that are calibratable with the aid of the mask used are reduced. It has been found that in the case of specific calibration structures, some of the equations of the equation system obtained by fully automatic differentiation of the optical simulation can be reduced in such a manner that one or more parameters are no longer contained in the resulting equation system—in other words, the number of parameters that are ascertainable with the aid of such a mask is reduced, which is advantageous for the required computation capacity. The parameters that are not ascertainable by use of a first mask can be determined, e.g., by way of a second mask with a suitable calibration structure, by means of which the parameters already ascertained by way of the first mask are not ascertainable. By way of example, through a periodic line structure as calibration structure, the parameters which influence the optical distortion in a direction perpendicular to the lines of the line structure can be ascertained or optimized, but not the parameters relating to a possible distortion in the direction of the lines. For the latter situation, a second calibration structure with a line structure rotated by 90° could be used. The fact that for this purpose it is also possible to use one and the same mask rotated by 90° (in which case the target design then also needs to be rotated by 90°) is self-evident to a person skilled in the art.

Even if just the provision of a fully automatically differentiable simulation is already advantageous over the known methods from a technical standpoint, the particular configuration of the simulation affords further advantages which are not realizable, or at least not straightforwardly realizable, in this way in the prior art.

If a metric that represents the differences is determined for a reference image simulated with the aid of the optical simulation and a recorded measurement image, in one preferred embodiment, a representation of the actual design of the mask that is directly comparable with the target design can be determined on the basis of said metric in the backward mode of the fully automatically differentiable simulation. Thus, in contrast to the prior art, the ultimate determination of deviations between target and actual states of the mask and the establishment of whether said deviations should be assessed as a defect of the mask then no longer have to be effected directly on the basis of simulated reference images and recorded measurement images. Rather, this comparison can be carried out on the basis of a representation of the target and actual states, namely of the target and actual designs, that has been freed of all optical deficiencies of a mask metrology device used.

The determination of a representation of the actual design that is comparable with the target design is even possible if the target design—as usual—is present in a vector format. Since the recorded measurement image is present in a raster format, in principle, in the course of creating a simulated reference image it is necessary for the vector data of the target designed to be converted into raster data for the simulated reference image in order that a metric that represents the differences can be determined. In this case, it is possible, in principle, for this conversion to be effected by use of a rasterization method that is unambiguously able to be separated from the optical simulation as a submethod, generally before the rest of the optical simulation. In the method according to the invention, too, the optical simulation can comprise a corresponding rasterization method, although this needs to be an automatically differentiable rasterization method. The parameters of the rasterization method can be calibrated together with the other parameters of the optical simulation, as has been described above.

If the rasterization method is automatically differentiable, it can be used as part of the optical simulation in the backward mode as well. Consequently, a representation of the actual design in accordance with the original representation of the target design can be achieved on the basis of the target designed after a pass through the backward mode of the metric that represents the differences between the reference image simulated on the basis of the target design and the recorded measurement image. If the target design is originally present in a vector format, then the actual design can likewise be represented in a vector format. It has proved to be particularly advantageous if, for the case where the target design comprises surfaces defined by polygons having more than three corners, said polygons are decomposed into a plurality of triangular surfaces, i.e. polygons having three corners, by use of triangular decomposition. Algorithms for the triangular decomposition of polygons are known from the prior art. If no polygons having more than three corners are present in the vector description of the target design, the complexity of the equation system obtained as a result of automatic differentiation can be simplified as a result.

The optical simulation can be based on an arbitrary propagation model, such as e.g. the thin-layer Kirchhoff model or the SEAGLE algorithm as described, e.g., in the article “Efficient inversion of multiple-scattering model for optical diffraction tomography” by Soubies et al. in “Optics Express,” volume 25, issue 17 from 2017. If a corresponding model is used, it can also be converted into a programming function that merely needs to be automatically differentiable. The automatic differentiation, the calculation and/or the optimization of the various parameters of such an automatically differentiated function using forward and backward modes and also the use of a calibrated function in the forward mode are known in principle from the prior art—albeit not in connection with a method for registering structures on microlithographic masks.

The computer program product according to the invention comprises program parts which are designed to carry out the method according to the invention. For explanation, reference is made to the statements above.

The method described above is preferably used to check a mask for defects before said mask is used for the exposure of substrates in the course of microlithography. The mask is then only used for the production of microstructure components if no relevant defects—i.e., defects which could adversely affect the later functionality of a microstructured component—are found. Even if deviations between target design and actual design of the mask are established, a mask may nevertheless be regarded as “defect-free” if said deviations are in a predefined tolerance range in which the desired functionality of the component to be produced is still ensured. For further explanation, reference is made to the statements above.

BRIEF DESCRIPTION OF DRAWINGS

The invention will now be described by way of example on the basis of advantageous embodiments with reference to the accompanying drawings, in which.

DETAILED DESCRIPTION

Figure 1:
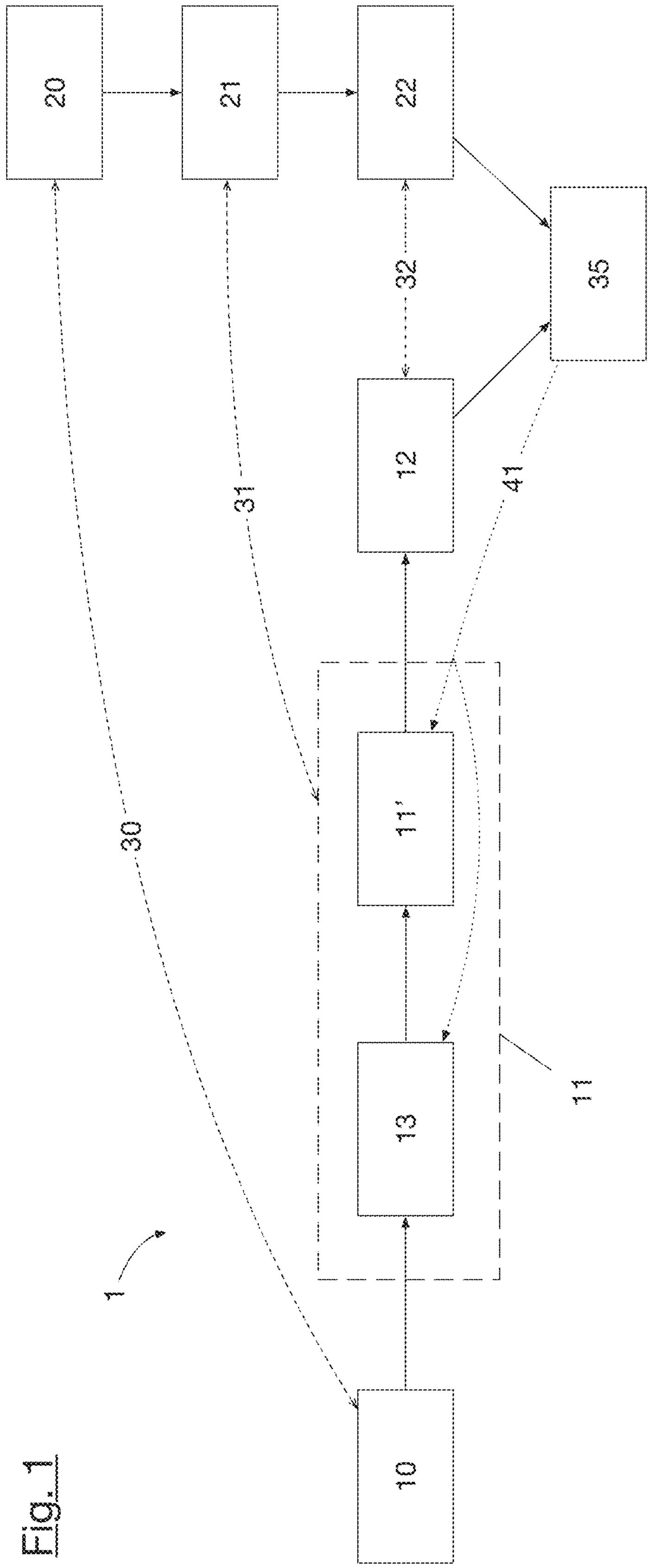
FIG. 1: shows a schematic illustration of a method according to the invention for registering structures on microlithographic masks.

FIG. 1 schematically illustrates one exemplary embodiment of a method 1 according to the invention for registering structures on microlithographic masks.

In the method, firstly, with respect to a real mask 20, a measurement image 22 of the mask 20 is recorded by a mask metrology device 21.

In parallel therewith, proceeding from a target design 10 that in principle corresponds to the structure of the real mask 20 (cf. arrow 30), with the aid of an optical simulation 11 that is intended to represent the optical properties of the mask metrology device 21 (cf. arrow 31), a simulated reference image 12 is created, which can be compared directly with the recorded measurement image 22 (cf. arrow 32).

In the exemplary embodiment illustrated, the target design 10 is present in a vector format, while the simulated reference image 12 regularly has to be present as a raster image, inter alia in view of a comparison 32 with the recorded measurement image 22. For this purpose, the optical simulation 11 comprises a rasterization method 13, which transforms the target design 10 from the original vector format into a raster format, before the actual optical simulation 11' follows that.

Up to this point the exemplary embodiment illustrated substantially corresponds to known prior art in which, by way of the comparison 32, it is possible to establish whether the mask 20, in comparison with the target design 10, has in particular defects which cast doubt on a proper functionality of semiconductors produced on the basis of the mask 20.

The exemplary embodiment according to the invention differs from the known prior art, however, in that the optical simulation 11 is fully—i.e., encompassing both the actual optical simulation 11' and the rasterization method—automatically differentiable, where the forward mode of the optical simulation 11 corresponds to the path from the target design 10 to the simulated reference image 12.

Since the optical simulation 11 is fully automatically differentiable, the various parameters both of the rasterization method 13 and of the actual optical simulation 11' can be determined in a resource-conserving manner through the use of the backward mode.

For this purpose, with respect to a mask 20 a measurement image 22 thereof is recorded, and with respect to the target design 10 of said mask a reference image 12 is simulated from said target design. For these two images 12, 22, a metric 35 representing the differences between the measurement image 22 and the reference image 12 is then determined. The metric 35 is thus a mathematical or numerical representation of a comparison 32 between measurement image 22 and reference image 12. The metric 35 can comprise, e.g., a pixelwise difference between recorded measurement image 22 and simulated reference image (12), a corresponding root mean square and/or a structure similarity index between the two images 12, 22.

Figure 2:
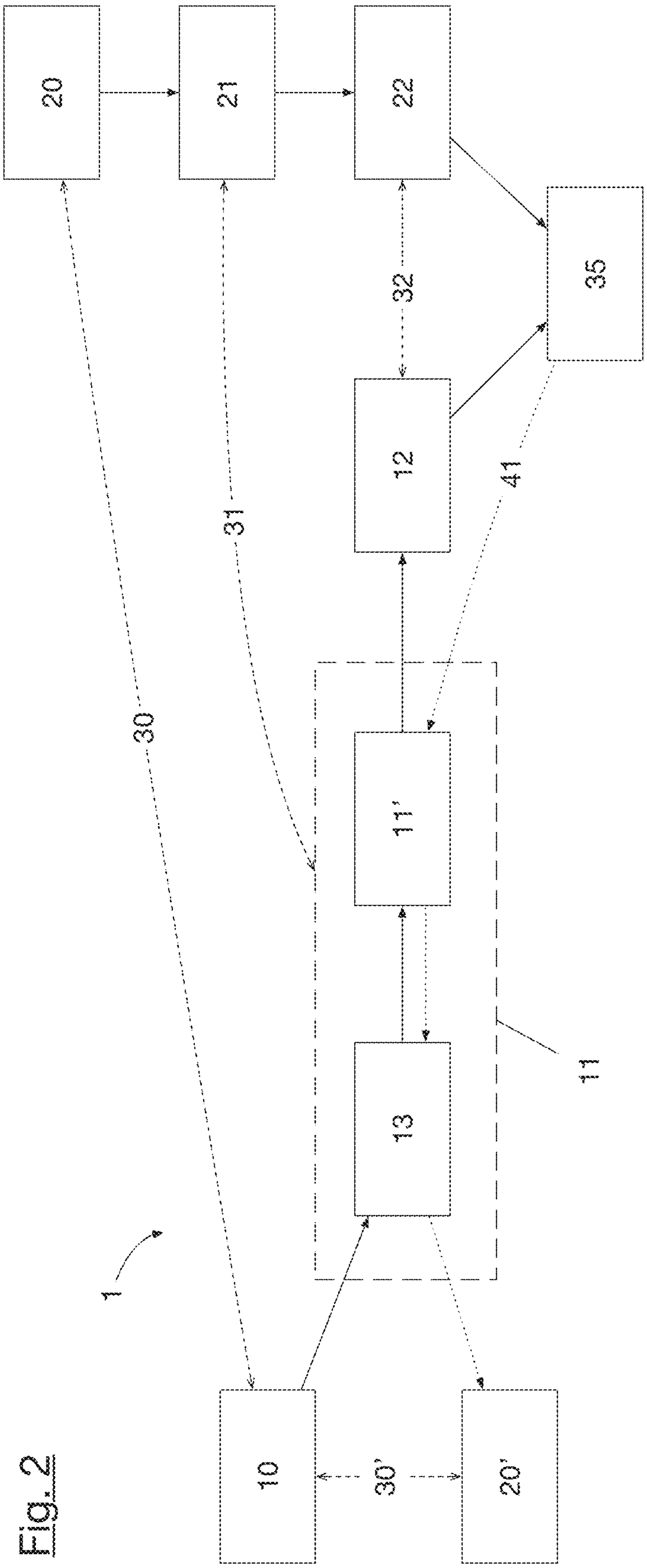
FIG. 2: shows one advantageous development of the method according to the invention in accordance with FIG. 1.

Irrespective of what information the metric 35 specifically contains, the latter must be suitable, in principle, on the basis of the target design 10 through use of the backward mode of the optical simulation 11, for creating a representation 20' of the actual design of the mask 20 that is directly comparable with the target design 10 (cf. FIG. 2). If the metric 35 has corresponding properties, the parameters of the optical simulation 11 comprising the rasterization method 13 and the actual optical simulation 11 or of the equation system developed therefrom with the aid of the automated differentiation can also be determined with manageable computational complexity on the basis of the metric 35 (cf. arrow 41). This property is used for the initial calibration of the optical simulation 11. Proceeding from arbitrarily chosen initial parameters for the optical simulation 11, by way of the metric(s) on the basis of different masks 20 and the associated target designs 10, the parameters of the optical simulation 11 can be adapted such that if a mask 20 corresponds to the target design 10, the simulated reference image 12 also corresponds to the recorded measurement image 22, that is to say that the optical simulation 11 thus suitably represents the optical properties of the mask metrology device 21.

The calibration can be simplified or accelerated if it is done using one or a plurality of verified mask(s) 20, in the case of which other checking methods ensured that it completely corresponds to the associated target design 10. Specifically, it can be assumed in this case that all differences between the simulated reference image 12 and the recorded measurement image 22 that are recorded in the metric 35 result solely from deviations of the optical simulation 11 from the optical properties of the mask metrology device 21.

If correspondingly verified masks 20 are not employed, there is additionally also still the possibility that a mask 20 actually does not completely correspond to the target design 10 thereof. The same can correspondingly be taken into account straightforwardly in the calibration of the optical simulation 11, however, even if, if appropriate, additional masks 20 then need to be registered for calibration purposes in order to improve the optical simulation 11.

Irrespective of whether or not verified masks 20 are used for the calibration, it is advantageous if the masks 20 used for the calibration have a calibration structure by which the parameters that are calibratable with the aid of the respective calibration structure are reduced. What are regularly appropriate for this are periodic line structures with which, e.g., parameters relating to distortions in the direction of the lines regularly cannot be calibrated, for which reason they also do not have to be taken into account all calculated in the determination of suitable parameters for the optical simulation on the basis of a line structure.

Once the optical simulation 11 has been sufficiently calibrated, it can be used afterward for the simulation of reference images 12 on the basis of a target design 10. The comparison with the measurement image 22 of a mask 20 recorded by the mask metrology device 21 appropriate for the optical simulation 11 (cf. arrow 32) can be carried out in accordance with the prior art, in principle.

However, the fully automatically differentiable optical simulation 11 gives rise to another possibility—not known heretofore in the prior art—of comparing the target design 10 with the actual design of the mask 20, which possibility will now be explained in greater detail with reference to FIG. 2.

Once the optical simulation 11 has been fully calibrated, an arbitrary masks 20 can be registered. A measurement image 22 of the mask 20 to be registered is recorded with the aid of the mask metrology device 21 to which the optical simulation 11 has been calibrated.

In parallel therewith, proceeding from the target design 10 that the mask 20 should actually have (cf. arrow 30), with the aid of the optical simulation 11, a simulated reference image 12 is created. Instead of a comparison of the simulated reference image 12 and the recorded measurement image 22, as known from the prior art, for the purpose of determining potential defects of the mask 20, the metric 35 that represents the differences between the two images 12, 22 and is already known from the calibration is determined. Said metric then, as indicated by arrow 41, in the backward mode of the optical simulation 41 becomes a real actual design that is based on the target design 10 and hence comparable in the representation 20', said actual design reproducing the real structure of the mask 10.

The determination of the actual design in a representation 20' that is directly comparable with the target design 10 enables potential defects of the real structure of the mask 20 to be determined in a particularly simple manner.

Particularly since—if the target design 10 is present in a vector format—the representation 20' of the actual design is also implemented in a vector representation, a direct check can be made directly on the basis of these vector data to establish whether, e.g., the various structure elements of the structure of the mask 20 have a sufficient width and a sufficient distance from one another. This also applies to the case where a triangular decomposition has previously been carried out on the target design 10 for reasons of efficiency of the optical stimulations 11 in the forward and backward modes. The representation 20' of the actual design that is determined in the backward mode then likewise has only polygons having a maximum of three corners, but this is generally unproblematic for the various examinations for potential defects. In principle, however, it is also possible, in the case of a corresponding representation 20' of the actual design, on the basis of the triangular decomposition of the target design 20, for triangles to be combined again to form polygons having more than three corners.

The data processing tasks described in this document, such as using optical simulation to convert a target design underlying a microlithographic mask into a simulated reference image, comparing the simulated reference image with a recorded measurement image, determining a metric from the recorded measurement image and the reference image, determining a representation of the actual design of the mask, and comparing the representation of the actual design of the mask with the target design for the purpose of determining possible defects of the mask, can be carried out by one or more computers that include one or more data processors configured to execute one or more computer programs that include a plurality of instructions according to the principles described in this document. The one or more computers can include one or more data processors for processing data, one or more storage devices for storing data, such as one or more databases, and/or one or more computer programs including instructions that when executed by the computing unit cause the computing unit to carry out the processes. The one or more computers can include one or more input devices, such as a keyboard, a mouse, a touchpad, and/or a voice command input module, and one or more output devices, such as a display, and/or an audio speaker. In some implementations, the one or more computers can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

A computer program can be written in any form of programming language, including compiled or interpreted languages, and it can be deployed in any form, including as a stand-alone program or as a module, component, subroutine, or other unit suitable for use in a computing environment.

For example, the one or more computers can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer system include one or more processors for executing instructions and one or more storage area devices for storing instructions and data. Generally, a computer system will also include, or be operatively coupled to receive data from, or transfer data to, or both, one or more machine-readable storage media, such as hard drives, magnetic disks, solid state drives, magneto-optical disks, or optical disks. Machine-readable storage media suitable for embodying computer program instructions and data include various forms of non-volatile storage area, including by way of example, semiconductor storage devices, e.g., EPROM, EEPROM, flash storage devices, and solid state drives; magnetic disks, e.g., internal hard disks or removable disks; magneto-optical disks; and CD-ROM, DVD-ROM, and/or Blu-ray discs.

In some implementations, the processes described above can be implemented using software for execution on one or more mobile computing devices, one or more local computing devices, and/or one or more remote computing devices (which can be, e.g., cloud computing devices). For instance, the software forms procedures in one or more computer programs that execute on one or more programmed or programmable computer systems, either in the mobile computing devices, local computing devices, or remote computing systems (which may be of various architectures such as distributed, client/server, grid, or cloud), each including at least one processor, at least one data storage system (including volatile and non-volatile memory and/or storage elements), at least one wired or wireless input device or port, and at least one wired or wireless output device or port.

In some implementations, the software may be provided on a medium, such as CD-ROM, DVD-ROM, Blu-ray disc, a solid state drive, or a hard drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

While the disclosure has been described in connection with certain examples, it is to be understood that the disclosure is not to be limited to the disclosed examples but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for registering structures on microlithographic masks, comprising:

converting, in a forward mode of an optical simulation that is fully differentiable, a target design underlying a mask into a simulated reference image;

comparing a recorded measurement image of the mask with the target design underlying the mask, wherein the simulated reference image converted from the target design underlying the mask is directly comparable with the measurement image;

determining a metric from the recorded measurement image and the reference image simulated in the forward mode, wherein the metric represents differences between the recorded measurement image and the simulated reference image;

determining, in a backward mode of the optical simulation taking into account of the metric determined from the recorded measurement image and the reference image simulated in the forward mode, a representation of an actual design of the mask that is directly comparable with the target design; and determining the possible defects of the mask based on a comparison of the representation of the actual design of the mask with the target design.

2. The method of claim 1, wherein parameters of the optical simulation are calibrated on the basis of one or a plurality of measurement images of verified actual designs of one or a plurality of masks and respectively associated target designs of the masks.

3. The method of claim 2, wherein the actual design and the associated target design of at least one mask used for the calibration have a calibration structure with which the parameters that are calibratable with the aid of the respective calibration structure are reduced.

4. The method of claim 3 wherein the calibration structure comprises a periodic line structure.

5. The method of claim 2, wherein the optical simulation comprises a differentiable rasterization method.

6. The method of claim 1, wherein the actual design and the associated target design of at least one mask used for calibration have a calibration structure with which the parameters that are calibratable with aid of a respective calibration structure are reduced.

7. The method of claim 6, wherein the optical simulation comprises a differentiable rasterization method.

8. The method of claim 6 wherein the calibration structure comprises a periodic line structure.

9. The method of claim 1, wherein the optical simulation comprises a differentiable rasterization method.

10. The method of claim 1, wherein the metric that represents the differences comprises a pixelwise difference between recorded measurement image and simulated reference image, a corresponding root mean square and/or a structure similarity index.

11. The method of claim 1, wherein the target design is present as vector data.

12. The method of claim 11, wherein surfaces defined by polygons having more than three corners are converted into a plurality of triangular surfaces by triangular decomposition.

13. A computer program product or a set of computer program products, comprising program parts which, when loaded into a computer or into networked computers, are designed to carry out the method as claimed in claim 1.

14. The computer program product or the set of computer program products of claim 13, wherein parameters of the optical simulation are calibrated on the basis of one or a plurality of measurement images of verified actual designs of one or a plurality of masks and respectively associated target designs of the masks.

15. The computer program product or the set of computer program products of claim 13, wherein the actual design and an associated target design of at least one mask used for a calibration have a calibration structure with which parameters that are calibratable with aid of the respective calibration structure are reduced.

16. The computer program product or the set of computer program products of claim 15 wherein the calibration structure comprises a periodic line structure.

17. The computer program product or the set of computer program products of claim 13, wherein the optical simulation comprises a differentiable rasterization method.

18. A microlithographic method in which, with aid of a projection exposure apparatus comprising an illumination device and a projection device, the image of a mask illuminated by use of the illumination device is projected by use of the projection device onto a substrate that is coated with a light-sensitive layer and is arranged in the image plane of the projection device, wherein before the exposure of the substrate, the mask is registered and examined for defects by way of a method as claimed in claim 1 and the exposure of the substrate is carried out only in the event of sufficient freedom from defects being established.

19. The microlithographic method of claim 18, wherein parameters of the optical simulation are calibrated on the basis of one or a plurality of measurement images of verified actual designs of one or a plurality of masks and respectively associated target designs of the masks.

20. The microlithographic method of claim 18, wherein the optical simulation comprises an automatically differentiable rasterization method.

* * * * *